United States Patent [19]

Ault

[11] 4,117,544
[45] Sep. 26, 1978

[54] MAGNETIC SINGLE-WALL DOMAIN BIAS FIELD CONTROL ARRANGEMENT

[75] Inventor: Cyrus Frank Ault, Wheaton, Ill.

[73] Assignee: Bell Telephone Laboratories, Incorporated, Murray Hill, N.J.

[21] Appl. No.: 800,447

[22] Filed: May 25, 1977

[51] Int. Cl.² .............................................. G11C 19/08
[52] U.S. Cl. ......................................... 365/28; 365/1; 365/8; 365/31; 365/32; 365/43
[58] Field of Search .................. 340/174 TF, 174 EB; 365/28, 8, 31, 43

[56] References Cited

U.S. PATENT DOCUMENTS

| | | | |
|---|---|---|---|
| 3,711,841 | 1/1973 | Geusic et al. | 365/28 |
| 3,927,234 | 9/1976 | Voegeli | 340/174 EB |
| 3,927,397 | 12/1975 | Chow et al. | 340/174 TF |

*Primary Examiner*—James W. Moffitt
*Attorney, Agent, or Firm*—William H. Kamstra

[57] ABSTRACT

A bias field control arrangement for correcting the bias field in accordance with stability range variations in magnetic domain thin film layers. A thin film layer is provided auxiliary to the layers, which auxiliary layer responds to external environmental conditions such as temperature in a manner substantially identical to that of the magnetic domain layers. A pair of register-detectors are defined on the layer in the form of permalloy domain propagating elements, the dimensions of the elements of one being optimized to propagate domains of a diameter larger than that of a domain of a diameter which is optimum in view of the stability range of the layers and the dimensions of the elements of the other being optimized to propagate domains of a diameter smaller than that of the optimum diameter domain. For normal operation, the domains will be propagated along both channels with equal facility and an output comparison section at the output of the detectors produces no control signal. The common bias field of the layers is thus normal and requires no correction. Should the bias field be too low or too high, domains of a diameter will be generated which will fail to propagate properly along one or the other channels. As a result, an output signal is generated which is employed to provide an augmenting or an opposing field to adjust the bias field upward or downward as required. Any errors in the propagation of domains are thus corrected.

21 Claims, 1 Drawing Figure

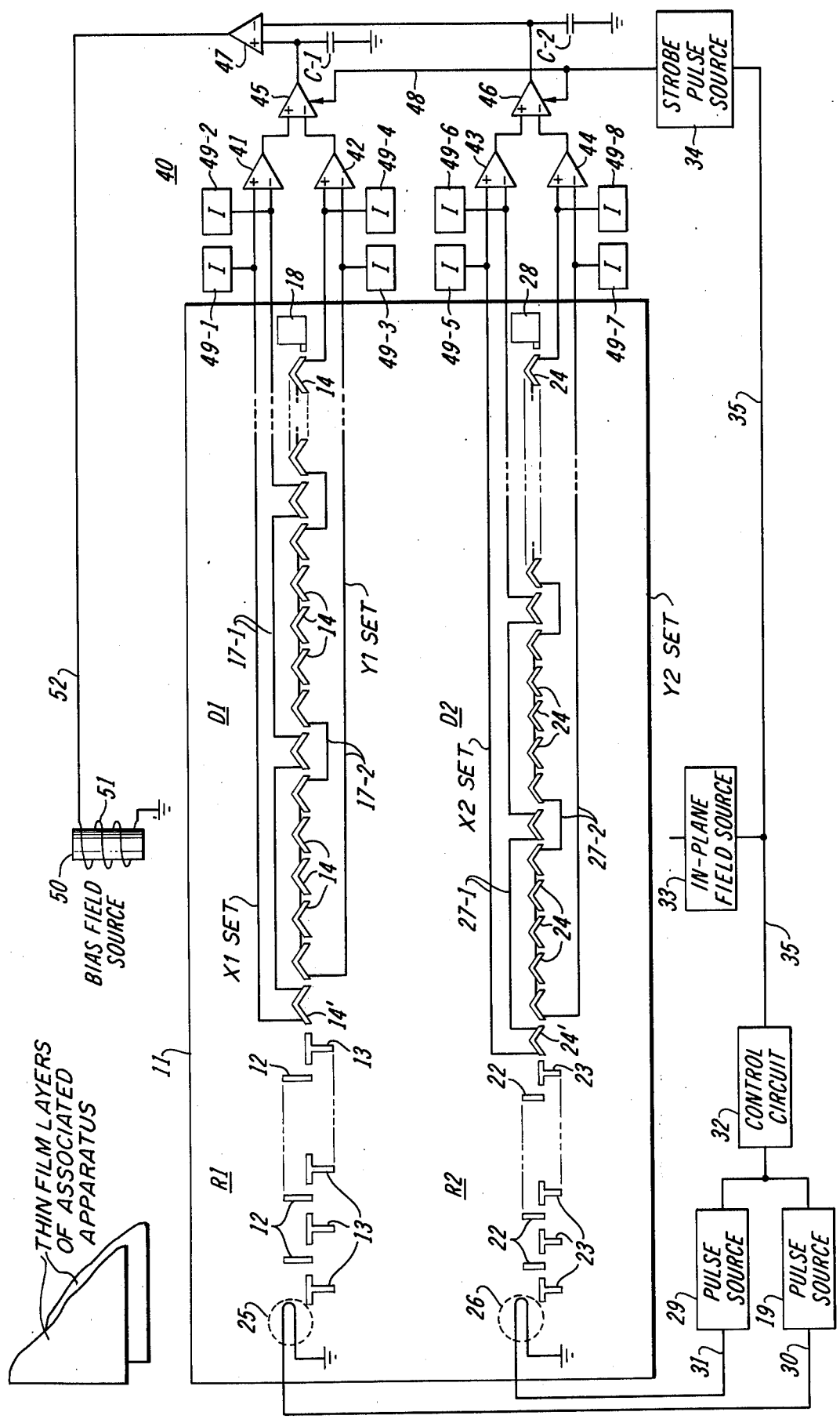

MAGNETIC SINGLE-WALL DOMAIN BIAS FIELD CONTROL ARRANGEMENT

BACKGROUND OF THE INVENTION

This invention relates to magnetic information storage and processing arrangements and more particularly to such arrangements in which stored binary information is represented in a magnetic medium as patterns of single-wall magnetic domains.

The advantcements in the single-wall magnetic domain technology in recent years have resulted in the realization of various and numerous data processing, memory, and other applications. The control of domain propagation in a thin film magnetic medium and the novel circuits achieved thereby are well-known and have been extensively treated in the general and patent literature. One mass memory arrangement, for example, is shown in the patent of P. I. Bonyhard et al., U.S. Pat. No. 3,701,132, issued Oct. 24, 1972, which memory is organized in the now familiar major-minor loop configuration where information is continuously circulated in a plurality of parallel, closed minor loops by an applied in-plane rotating magnetic field. A major loop at right angles and contiguous to the minor loops operates to accept information from the minor loops and acts as a temporary store to recirculate information transferred from the minor loops past a write-read position prior to restoration of the information (or replacement information) to vacancies in the minor loops created by the initial information transfer.

As mentioned, such a single-wall domain memory arrangement and others are well-known as in the manner in which the domains (commonly termed "bubbles") are initially created in the thin film medium. An external bias field of suitable polarity is applied perpendicularly to the plane of the medium to reduce randomly oriented, elongated domain patterns to the individual cylindrical, bubble-like domains usable as binary bit representations. The magnitude of the bias field largely controls the diameters of the bubbles created and as the bias field strength is increased, the diameter of a bubble is decreased until it ultimately collapses. Manifestly, it is important that the strength of the bias field be adjusted to ensure a stable bubble diameter, taking into consideration the properties of the material forming the magnetic medium. Were the bubbles to be permitted to increase or decrease in size during memory operation, serious domain interaction and variation in coupling to drive fields could result which, in turn, could lead to improper domain movement, as is also known.

Generally, in the past, a magnetic bias field value was selected to create an operating domain diameter which value lay substantially in the middle of a bias field range which corresponds to the stability range of domain diameters. The widest possible operating margins were thus ensured. The bias field was normally maintained at a constant level and the properties of the material of the thin film in which the domains were to be generated were prescribed to ensure a domain stability range which is constant as a function of temperature, for example, over a reasonable temperature range. As is known, materials having such properties were difficult to achieve, and in one prior art magnetic bubble arrangement, the bias field was adapted to vary as the stability range of the magnetic material varied with temperature. In the J. E. Geusic et al., U.S. Pat. No. 3,711,841, issued Jan. 16, 1973, for example, a bias field varying arrangement is described in which the bias field is supplied by a permanent magnet of a material having a temperature coefficient which causes the field to vary in a manner corresponding to the variations with temperature of the thin film stability range. As a result, the bias field, in tracking the stability range changes, remains within the operating bias range of the film in which the domains are moved. The reliability of the functional single-wall domain arrangement with which the permanent magnet bias field source is associated is thus enhanced.

The afore-mentioned Geusic et al., bias field varying arrangement offers one useful and advantageous means for contending with stability range changes in an environment where variations in steady state temperature may occur which affect equally the thin film layers and the permanent magnet biasing field source. Transient temperature changes may also cause changes in the stability range of a thin film magnetic layer and hence optimum domain diameter. Importantly, such transient temperature changes may not affect the biasing field magnet. Thus, for example, as a magnetic domain memory is assessed, power dissipation may vary and any such variation on the thin film layer will cause its temperature to be at variance with that of the biasing field magnet. This transient change would disappear if the memory usage were constant. In many memory applications, however, usage is not constant, and a continuing and varying temperature difference exists between the memory layers and the biasing magnet. Other factors may also affect the stability range of a given magnetic thin film. External mechanical stress, however slight, such as the flexing of a thin film substrate, for example, may cause serious stability range changes. Exposure to the presence of an external gross magnetic field could have similar detrimental effects.

It is, accordingly, one object of this invention to provide a new and novel, single-wall magnetic domain arrangement for tracking variations in the stability range of a thin magnetic film due to temperature changes and other causes.

Another object of this invention is the control of the biasing field of a single-wall magnetic domain arrangement in accordance with changes in the stability range of the thin film in which the single-wall domains are generated and propagated.

Still another object of this invention is a new and novel magnetic single-wall domain arrangement in which the biasing field is adjusted to achieve optimum domain diameters in view of changes in the thin film stability range.

SUMMARY OF THE INVENTION

The foregoing and other objects of this invention are realized in one specific illustrative embodiment thereof comprising a thin film layer having domain size sensing circuitry provided thereon, the layer being provided as an auxiliary to the layer or layers of, say, a single-wall domain magnetic memory of the character briefly described hereinbefore. Essential to the operation of the invention is the fact that the auxiliary layer and the layers with which it is associated are of a material having identical properties and are so mounted that each responds to external environmental influences in a substantially identical manner. The domain size sensing circuitry of the auxiliary layer comprises two domain generators feeding, respectively, a pair of single-wall domain registers, one optimized for small diameter domains and the other for larger diameter domains. The registers may conventionally comprise patterns of T and bar permalloy overlays responding to a rotating in-plane magnetic field for displacing domains, as is known. In the register optimized for small domains, the T's and bars are dimensioned smaller than the corresponding elements of the registers optimized for larger domains.

The domain generators for the two registers are adapted to create single-wall domains at predetermined numbers of cycles of the rotating field employed for propagating domains in the associated magnetic domain apparatus. In the present case, the generators are assumed to create domains at the input ends of the registers at every sixth rotation of the rotating field. The propagation overlays of each register are dimensioned so that domains having diameters to fall within the stability range of the layer materials will be propagated with equal facility in each register. Accordingly, if the bias field is of the proper value for the environment in which the domain arrangement is operated, the generated domains will arrive at the register ends at the same time.

Each register is provided at its output end with a detector section comprising a series of well-known permalloy chevron overlays electrically connected together in each detector section to form two chevron sets. In one chevron set, which may be designated set X, every sixth chevron is electrically connected; and in the other set, which may be designated set Y, the five chevrons between every sixth chevron are electrically connected. As a domain enters a detector section and is propagated therethrough, it will normally appear at every sixth detection chevron for every six rotations of the applied rotating field. At each sixth chevron position, the presence of a domain is magnetoresistively sensed. An output signal is represented as a small change in voltage across each chevron influenced by the presence of a single-wall domain. For a properly determined bias field, the domains, having entered the detection sections of the registers at the same time, will also generate simultaneous output signals at each sixth chevron position. Comparison circuitry is provided which serves to disable a bias field adjustment signal generator when simultaneous signals are thus generated in each detection section. The signal comparison is, in turn, controlled by a strobe signal occurring at each sixth rotation of the propagating rotating field. A normal generation and propagation of single-wall domains in the associated apparatus such as a magnetic memory has been briefly considered. That is, the fact that no bias adjustment signal was generated indicates that the bias field was properly adjusted to create domains lying within the stability range of each of the thin film layers comprising the magnetic domain apparatus and within that of the auxiliary layer.

Two other biasing field conditions are possible: the field is of insufficient magnitude to create domains of optimum diameter or the field is too high to create such domains. In the former case, the larger diameter domains will be properly propagated along the register in which the permalloy elements are optimized for the larger domains and an output signal will be generated at each sixth position in the register detection section as described in the foregoing. On the other hand, the large domains will fail to propagate along the register optimized for smaller diameter domains in step with the corresponding domains in the other detection section. As a result, domains may fail to appear at chevron detection set X during a strobe readout. Instead, domains will tend to accumulate at the chevron set Y between the latter chevrons. A larger output signal will, accordingly, be generated, which when compared with the signal generated by the other detection section, causes the bias field adjustment signal generator to produce a first adjustment signal of one polarity.

When the bias field is too high to create domains of optimum diameter, that is, when small domains are generated, these will be properly propagated along the register in which the permalloy elements are optimized for smaller diameter domains. As a result, an output will be generated at each sixth position in the register detector. The small diameter domains will, however, fail to propagate along the register optimized for larger domains in step with the corresponding domains in the other detection section. Again, as a result, domains may fail to appear at chevron detection set X during a strobe readout and, instead, tend to accumulate at the chevron set Y. A larger output signal will accordingly be generated, this time, however, at the smaller domain optimized register output end. This signal is compared with the signal generated by the other detection section, the results of which comparison causes the bias field adjustment signal generator to produce a second adjustment signal of the opposite polarity.

The adjustment signals thus generated are conveniently employed to cause an augmentation of or an opposition to the bias field conventionally created by a permanent magnet as necessary to limit the bias field to its proper operating range. In the foregoing, two simple variations from a normal bias field condition were briefly described. A bias field adjustment arrangement according to this invention is advantageously considerably more versatile. For example, domain propagation error of a low degree may generate voltage signals in both the X and Y detection sections of either register. Maximum propagation error represented by domains at all of the chevrons of the Y detection section of either register will generate a maximum voltage signal. A finally generated bias field adjustment signal of either polarity may thus also vary in amplitude according to the magnitude of domain propagation error. A bias field adjusting arrangement according to this invention thus presents a highly versatile and accurate means for virtually instantaneously responding to changes in the stability range of a magnetic domain thin film medium. Assuming a typical rotating field frequency of 60 kilohertz, the exemplary arrangement briefly considered in the foregoing is able to provide a bias field correcting signal every 100 microseconds.

BRIEF DESCRIPTION OF THE DRAWING

The objects and features of a single-wall magnetic domain bias field adjustment arrangement according to the principles of this invention will be better understood from a consideration of the detailed description of the organization and operation of one specific illustrative embodiment thereof which follows when taken in conjunction with the accompanying drawing, the single FIGURE of which shows in schematic form a two-channel bias adjustment arrangement according to this invention which may be employed in association with other domain propagating apparatus, such as, for example, a single-wall domain magnetic memory, not shown.

DETAILED DESCRIPTION

One specific bias field control arrangement according to this invention which may advantageously be employed as an adjunct to a mass magnetic domain memory, for example, is shown in the drawing as comprising a thin film layer 11 in which single-wall domains can be created and propagated, layer 11 having affixed thereon conventional permalloy elements for performing the novel function of the invention. Materials suitable for layer 11 are known in the art; the operation of the invention, however, imposes the requirement that the material be selected so that its domain diameter stability range varies substantially identically to that of the material of the thin film layer or layers of the magnetic domain apparatus with which the control arrangement of the invention is adapted for use in its reaction to environmental conditions such as temperature, external stress, magnetic fields, and the like. The material of layer 11 will accordingly normally be the same as that of the layer or layers of the associated apparatus.

The operative circuitry of the control arrangement of the drawing is divided into a pair of registers R1 and R2 each comprising familiar bar and T-shaped magnetically soft permalloy elements coupled to layer 11. Thus, register R1 comprises bars 12 and T-shaped elements 13 and register R2 comprises bars 22 and T-shaped elements 23. The bar and T-shaped elements are arranged to respond to a magnetic field rotating clockwise in the plane of layer 11, which field is supplied by a conventional source to be considered hereinafter. The input end of each register R1 and R2 is provided with a single-wall domain generator 25 and 26, respectively. Generators 25 and 26 may conveniently comprise mechanisms of the character described in U.S. Pat. No. 3,789,375 of Y. S. Chen et al., issued Jan. 29, 1974. The output ends of registers R1 and R2 are coupled respectively to the input ends of a pair of detectors D1 and D2, each comprising a series of conventional permalloy chevron overlays. Thus, detector D1 comprises a plurality of chevrons 14 and detector D2 comprises a plurality of chevrons 24. In each detector, the chevrons are electrically connected in corresponding sets. Thus, in detector D1, beginning with the first chevron 14', every sixth chevron 14 is electrically connected in an X1 set by an electrical circuit 17-1 and every chevron 14 between the latter chevrons is electrically connected in a Y1 set by an electrical circuit 17-2. Similarly, in detector D2, beginning with the first chevron 24', every sixth chevron 24 is electrically connected in an X2 set by an electrical circuit 27 and every chevron 24 between the latter chevrons is electrically connected in a Y2 set by an electrical circuit 27-2. Only representative permalloy elements are shown in the drawing for both registers and detectors; it will be appreciated, however, that because of their extremely small size, in practice each register may comprise many hundreds of elements and each detector will comprise sets of chevrons numbering in the order of 1000 sets. Each detector D1 and D2 is terminated in a single-wall domain annihilator element 18 and 28, respectively. The latter elements may comprise any known elements providing a high magnetic field for reducing single-wall domains below their stable diameters. For example, a guard ring arrangement as taught in U.S. Pat. No. 3,729,726 of A. H. Bobeck, issued Apr. 24, 1973, may advantageously be employed at the termination of the detectors.

In accordance with the principles of this invention, the magnetic permalloy elements of both registers and detectors are dimensioned to propagate single-wall domains of optimum diameter in view of the normal stability ranges of the thin film layer 11 and that of the layer or layers of the associated apparatus with equal facility. The dimensions of the propagating elements of register R1 and detector D1, however, are optimized to propagate domains of a diameter greater than the afore-mentioned optimum diameter. The dimensions of the propagating elements of register R2 and detector D2, on the other hand, are optimized to propagate domains of a diameter less than the afore-mentioned optimum diameter. The reasons for the difference in element dimensions will become apparent from the description of illustrative operations of the control arrangement of the invention hereinafter.

The electrical loops of domain generator 25 and 26 are connected to pulse sources 19 and 29 by conductors 30 and 31, respectively. The outputs of the latter sources are controlled by timed signals originating at a control circuit 32 which latter circuit also controls the opertion of an in-plane magnetic field source 33, previously mentioned, and a strobe pulse source 34, the latter circuits via a conductor 35. THe external circuits just referred to are shown in block symbol form only, their detail being readily envisioned by one skilled in the art considering the functions to be ascribed thereto hereinafter. Indeed, circuits 32, 33, and 34 are assumed as being already present in the apparatus with which the control arrangement of this invention is associated. Accordingly, these circuits need not be further described for a complete understanding of this invention.

At their output ends, the electrical circuits 17 and 27 of detectors D1 and D2 provide inputs for a signal comparison section 40. The latter section comprises three stages of operational amplifiers, the final stage of which generates the bias field control signal. Thus, circuits 17-1 and 17-2 each provide a pair of inputs for amplifiers 41 and 42, respectively. Similarly, circuits 27-1 and 27-2 each provide a pair of inputs for amplifiers 43 and 44, respectively. Amplifiers 41 and 42 in turn provide a pair of inputs for a first, second stage amplifier 45 and amplifiers 43 and 44, in turn, similarly provide a pair of inputs for a second, second stage amplifier 46. The outputs of the latter amplifiers provide a pair of inputs to a final amplifier 47. Both inputs to the latter amplifier have storage capacitors C-1 and C-2 connected to ground. The outputs of amplifiers 45 and 46 are controlled by signals from strobe pulse source 34 via conductor 48. The comparison section 40 is completed by the provision of a plurality of constant current sources 49 connected to the output circuits of detectors D1 and D2. Thus, sources 49-1 and 49-2 are connected to the two ends of circuit 17-1; sources 49-3 and 49-4 are connected to the two ends of circuit 17-2; sources 49-5 and 49-6 are connected to the two ends of circuit 27-1; and sources 49-7 and 49-8 are connected to the two ends of circuit 27-2. Current sources of the character required for the operation of this invention are also well-known in the art and need not be described further than to specify their function.

A bias field source 50 for both the control arrangement of the drawing and the apparatus with which the latter is associated comprises a permanent magnet of a character well-known in the magnetic single-wall domain art. In accordance with the present invention, a winding means 51 is inductively coupled to magnet 50 which winding means is connected at one end to ground and at the other end to the output of amplifier 47 via conductor 52.

With the foregoing organization of a bias field control arrangement according to this invention in mind, illustrative operations thereof may now be considered. For a first such operation, it will be assumed that the signal-wall domains generated in layer 11 (and in the layers of the associated apparatus) are of optimum diameter in view of the normal stability range of the material of the layers. In the arrangement of the drawing, domains are generated every sixth rotation of the in-plane rotating field. Pulse sources 19 and 29 are thus controlled by control circuit 32 to apply simultaneous input pulses to generators 25 and 26 to create domains at those points. For purposes of description, it will also be assumed that domain generation has been in progress and that optimum diameter domains have been propagated along registers R1 and R2 and occupy the correct positions at a given readout time as determined by a signal from strobe pulse source 34. The latter source generates a strobe signal also every sixth rotation of the in-plane field under control of control circuit 32. Accordingly, for a normal operation at any strobing instant, a domain will be present at each chevron of the X set of chevrons of each detector D1 and D2, and none will be present at any of the chevrons of the Y set of chevrons of either detector. With constant currents being applied to circuits 17-1 and 27-1 by sources 49-1, 49-2, 49-5, and 49-6, and in accordance with magnetostrictive readout, the resistance of the occupied chevrons will increase and hence the voltages across the input terminals of operational amplifiers 41 and 43 will also increase. The voltages across the input terminals of amplifiers 42 and 44 will be unchanged. The outputs of both amplifiers 41 and 43 will rise positively, which outputs are applied to the positive inputs of second-stage amplifiers 45 and 46. The positive going outputs of the latter amplifiers are applied under the control of strobe pulse source 34 to the inputs of final stage amplifier 47. Since both inputs are equally energized, no output is generated by amplifier 47. As a result, bias field magnet winding 51 is not energized, and magnet 50 generates only its normal biasing field on the layer 11 and the layers of the associated apparatus.

In a second illustrative operation of a bias field control arrangement according to this invention, it will be assumed that the field generated by magnet 50 is insufficient in view of a variation in the stability range of the thin film layers. In this case, the domains being generated by generators 25 and 26 will have a larger diameter than that of the domains normally produced. These will be propagated along registers R1 and R2, however, not with equal facility. The propagating permalloy elements of register R1 and detector D1 are dimensioned optimally for such larger diameter domains and these are propagated normally through detector D1 to its output end. As a result, at any strobe instant, domains will be found only at the chevrons 14 or the X set of chevrons of detector D1. The outputs of amplifiers 41, 42, and 45 will, accordingly, be as previously described and amplifier 45 will again pply a positive going signal to the positive input of final stage amplifier 47.

The domain propagating elements of register R2 and detector D2, on the other hand, are dimensioned optimally to propagate domains of smaller diameter than that of domains normally produced. As a result, the larger diameter domains will fail to propagate properly and at any strobe instant, domains will be found both at the chevrons 24 of the X set and at the chevrons 24 of the Y set of detector D2. Depending upon the degree of propagation error, domains will be present at more than one chevron 24 of each Y set. As a result, the voltage signal applied to the terminals of amplifier 44 will be greater than that applied to the corresponding terminals of amplifier 43. Amplifier 46 will, accordingly, have positive going signals applied to both its positive and negative input terminals, with a greater signal being applied to the latter terminal. Accordingly, a negative output is generated by amplifiers 46 which is now applied to the negative input terminal of final stage amplifier 47. The latter circuit, as a result, applies a positive output current via conductor 52 to winding 51. Winding 51 is coupled to magnet 50 in a sense such that the positive current generates a field of a polarity with augments the field generated by magnet 50. In accordance with the operation of this invention, with the bias field thus adjusted upwardly, the diameter of the generated domains will be reduced to a dimension consistent with the instant stability range of the thin film layers.

Another bias field condition which the arrangement of this invention advantageously corrects is that in which the field is greater than that required to maintain domains of optimum diameter. In this case, the domains being generated by generator 25 and 26 will have a smaller diameter than that of the domains normally produced. These will also be propagated along registers R1 and R2, again however, not with equal facility. The propagating permalloy elements of register R1 and detector D2 are now dimensioned optimally for such smaller diameter domains and these are propagated normally through detector D2 to its output end. As a result, at any strobe instant, domains will be found only at the chevrons 24 of the X sets of chevrons of detector D2. The outputs of amplifiers 43, 44, and 46, will, accordingly, be as previously described for normal operation and amplifier 46 will again apply a positive going signal to the negative input terminal of final stage amplifier 47.

Since the domain propagating elements of register R1 and detector D1 and dimensioned optimally to propagate domains of greater diameter than that of domains normally produced, the smaller domains presently being maintained by the elevated bias field will fail to propagate properly. Accordingly, at any strobe instant, domains will be found both at the chevrons 14 of the X set and at the chevrons 14 of the Y set of detector D1. Again depending upon the degree of propagation error, domains will be present at more than one chevron 14 of each Y set. As a result, the voltage signal applied to the terminals of amplifier 42 will be greater than that applied to the corresponding terminals of amplifier 41. Amplifier 45 will accordingly have positive going signals applied to both its positive and negative input terminals, with a greater signal being applied to the latter terminal. Accordingly, a negative output is generated by amplifier 45 which is now applied to the positive input terminal of final stage amplifier 47. The latter circuit, as a result, applies a negative output current via conductor 52 to winding 51. This negative current generates a field of a polarity which opposes the field generated by magnet 50. With the bias field thus adjusted downwardly, the diameter of the generated domains will increase to a dimension consistent with the instant stability range of the thin film layers. Capacitors C-1 and C-2 connected between ground and the terminals of final stage amplifier 47 provide means for storing the output voltages of amplifiers 45 and 46 between strobed readout times. Conventionally, the domains propagated along detectors D1 and D2 are stripped out at the end of each by annihilator means 18 and 28.

It will be appreciated that the output signals of amplifier 47 may vary in magnitude as determined by the degree of propagation error. This follows from the fact that domains may occupy chevron positions in the Y sets of chevrons from one chevron to all the chevrons of the set, the latter condition producing the maximum output signals at amplifier 47. As mentioned hereinbefore, the frequency of the in-plane rotating field was assumed as being typically 60 kilohertz. Accordingly, with domains being generated by generators 25 and 26 at each sixth revolution of that field, a bias field correction signal is provided every 100 microseconds by the arrangement of this invention. The division of the basic rotating field frequency as assumed in the foregoing is not, however, to be considered as limiting of the inention. The frequency of generation of the bias field cor-. recting signal may, accordingly, be increased or decreased by dividing the frequency of the rotating field by a greater or lesser divisor as indicated by the requirements of the apparatus with which the arrangement of the invention is adapted for use. In that case, the X sets of chevrons of both detectors D1 and D2 will be correspondingly spaced.

What has been described is considered to be only one illustrative bias field control arrangement according to the principles of this invention. Accordingly, various and numerous other arrangements may be devised by one skilled in the art without departing from the spirit and scope of this invention as defined by the accompanying claims.

What is claimed is:

1. A control arrangement for use in association with single-wall magnetic domain apparatus having thin-film layer means in which single-wall domains are maintained by a bias field and propagated by an in-plane rotating field, said arrangement comprising a thin-film magnetic bias field control layer in which single-wall magnetic domains can be generated and propagated, said bias field control layer having substantially the same properties as said layer means of said apparatus, a first pattern of magnetic propagating elements coupled to said bias field control layer defining a first channel including a first detector section, a second pattern of magnetic propagating elements coupled to said bias field control layer defining a second channel including a second detector section, each of said elements of said first and second channel being dimensioned for optimum propagation of domains of a first and a second predetermined diameter, respectively, first electrical circuit means for each of said channels for connecting elements of said first and second detector section in first groups including every $n$th element, second electrical circuit means for each of said channels for connecting elements of said first and second detector section in second groups including each of the elements between said elements of said first groups, and means energizable to generate magnetic domains in each of said channels of a diameter as determined by the magnitude of said bias field, said domains being propagatable long said channels by said in-plane rotating field, said first and second electrical circuit means of each of said channels being energizable by the presence of domains at the elements of said first and second groups of elements to present voltage signals corresponding to the number of domains at each of said groups of elements.

2. A control arrangement as claimed in claim 1 also comprising first and second comparison circuit means for said channels, respectively, for generating first and second output signals indicative of the relative magnitudes of said voltage signals in said first and second electrical circuit means of each of said detector sections.

3. A control arrangement as claimed in claim 2 also comprising a third comparison circuit means energizable responsive to said first and second output signals for generating a control signal indicative of the diameter of said generated domains.

4. A control arrangement as claimed in claim 3 also comprising means for adjusting the magnitude of said bias field energizable responsive to said control signal.

5. A magnetic single-wall domain arrangement comprising a thin-film magnetic layer of a material in which single-wall domains can be generated and propagated, said material having a predetermined domain diameter stability range, a first and second pattern of overlay elements coupled to said layer, each pattern defining first and second propagating channels including a first and a second detector section, respectively, the elements of said first channel being dimensioned for optimum propagation of domains of a large diameter with respect to said predetermined stability range and the elements of said second channel being dimensioned for optimum propagation of domains of a small diameter with respect to sid predetermined stability range, first electrical circuit means for each of said channels for connecting elements of said first and second detector section in first groups including every $n$th element, and second electrical circuit means for each of said channels for connecting elements of said first and second detector sections in second groups including each of the elements between said elements of said first groups.

6. A magnetic single-wall domain arrangement comprising a thin-film magnetic layer of a material in which single-wall domains can be generated and propagated, said material having a predetermined domain diameter stability range, a pattern of overlay elements coupled to said layer defining a propagating channel including a detector section, the elements of said channel being dimensioned for optimum propagation of domains of a predetermined diameter with respect to said stability range, first electrical circuit means for said channel for connecting elements of said detector section in a first group including every $n$th element, and second electrical circuit means for said channel for connecting elements of said detector section in second groups including each of the elements between said elements of said first group.

7. In combination with single-wall magnetic domain apparatus including at least a first thin-film layer in which domains can be maintained and propagated, a bias field for maintaining said domains, and an in-plane rotating field for propagating said domains, a bias field control arrangement comprising a second thin-film magnetic layer of a material having substantially the same magnetic properties as the material of said first layer, said second layer being positioned within said bias field and said rotating field, a first pattern of magnetic propagating elements coupled to said second layer defining a first channel including a first detector section, a second pattern of magnetic propagating elements coupled to said second layer defining a second channel including a second detector section, each of said elements of said first and second channels being dimensioned for optimum propagation of domains of a first and a second predetermined diameter, respectively, means energizable to generate domains in each of said channels of a diameter as determined by the magnitude of said bias field at each $n$th revolution of said rotating field, the domains being propagatable along said channels by said rotating field, first electrical circuit means for each of said channels for connecting propagating elements of said first and second detector section in said first groups including every $n$th element, and second electrical circuit means for each of said channels for connecting propagating elements of said first and second detector section in second groups including each of the elements between said elements of said first groups, said first and second electrical circuit means of each of said channels being energizable by the presence of domains at the propagating elements of said first and second groups of elements to present voltage signals of a magnitude corresponding to the number of domains at each of said groups of elements.

8. The combination as claimed in claim 7 also comprising first and second comparison circuit means for said first and second channel, respectively, for generating first and second output signals indicative of the relative magnitudes of said voltage signals in said first and second electrical circuit means on each of said detector sections.

9. The combination as claimed in claim 8 also comprising third comparison circuit means energizable responsive to the application of said first and second output signals for generating a control signal indicative of the diameter of said generated domains.

10. The combination as claimed in claim 9 also comprising means for interrogating said first and second comparison circuit means and for applying said first and second output signals to said third comparison circuit means at every $n$th revolution of said rotating field.

11. The combination as claimed in claim 10 also comprising means for adjusting the magnitude of said bias field energizable responsive to said control signal.

12. The combination as claimed in claim 7 in which the propagating elements of said first and second detector section of each of said channels comprise substantially chevron-shaped elements.

13. A bias field control arrangement adapted to adjust the bias field of single-wall magnetic domain apparatus having at least a first thin-film layer of a material in which domains can be generated and propagated, a bias field for controlling said domains at a normal predetermined diameter, and an inplane rotating field for propagating said domains in said first layer, said control arrangement comprising a second thin-film layer of a material having magnetic properties substantially identical to the magnetic properties of the material of said first layer, said second layer being positioned within said bias field and said rotating field, a first pattern of magnetic propagating elements coupled to said second layer defining a first channel including a first detector section, a second pattern of magnetic propagating elements coupled to said second layer defining a second channel including a second detector section, each of the propagating elements of said first channel being dimensioned for optimum propagation of domains of a diameter larger than said predetermined diameter, each of the propagating elements of said second channel being dimensioned for optimum propagation of domains of a diameter smaller than said predetermined diameter, and each of said propagating elements of both said channels being dimensioned for equal propagation of domains of said predetermined diameter, means energizable to generate domains in each of said channels of a diameter as controlled by the magnitude of said bias field at each $n$th revolution of said rotating field, the domains being propagatable along said channels by said last-mentioned field, first electrical circuit means for each of said channels for electrically connecting every $n$th propagating element of said first and second detector section, second electrical circuit means for each of said channels for electrically connecting each of the propagating elements between said $n$th elements of said first and second detector section, said first and second electrical circuit means of each of said channels being energizable by the presence of domains at its respective electrically connected propagating elements to present voltage signals of a magnitude and polarity corresponding to the number of domains at said respective electrically connected elements.

14. A bias field control arrangement as claimed in claim 13 also comprising output comparison circuit means energizable responsive to said voltage signals for generating a bias field control signal of a magnitude and polarity as determined by said voltage signals and means for periodically energizing said output comparison circuit means every $n$th revolution of said in-plane rotating field.

15. A bias field control arrangement as claimed in claim 14 also comprising inductive means energized responsive to said control signal for generating a magnetic field for augmenting and opposing said bias field as determined by the magnitude and polarity of said control signal.

16. A bias field control circuit for single-wall magnetic domain apparatus having an in-plane rotating field comprising a magnetic medium in which single-wall domains can be generated and propagated subject to the same propagation conditions as the conditions affecting domain propagation in the magnetic media of said apparatus, a first pattern of propagating elements coupled to said medium defining a first propagating channel, a second pattern of propagating elements coupled to said medium defining a second propagating channel, each of the elements of said first channel being dimensioned for optimum propagation of domains of a first predetermined diameter, each of the elements of said second channel being dimensioned for optimum propagation of domains of a second predetermined diameter, means for generating domains in each of said channels at each $n$th revolution of said rotating field, bias field means for generating a bias field for controlling the diameter of said domains in both said control circuit magnetic medium and in the magnetic media of said magnetic domain apparatus, said rotating field propagating domains along each of said first and second channels and in said magnetic media of said magnetic domain apparatus, output circuit means having voltage signals caused therein responsive to the propagation of domains of said first predetermined diameter along said second channel and the propagation of domains of said second predetermined diameter along said first channel for generating domain diameter signals, and means responsive to said last-mentioned signals for controlling said bias field means for adjusting the magnitude of said bias field.

17. A bias field control circuit as claimed in claim 16, said output circuit means including a first circuit for each of said channels for electrically connecting every nth propagating element of an output section of said channels and a second circuit for electrically connecting each propagating element between said nth propagating elements of said output sections of said channels and means for periodically energizing said output circuit means each nth revolution of said rotating field.

18. In combination with single-wall magnetic domain apparatus including at least a first thin-film layer in which domains can be maintained and propagated, a bias field source for generating a bias field for maintaining said domains, and an in-plane rotating field for propagating said domains, a bias field control arrangement comprising a second thin-film magnetic layer of a material having substantially the same domain propagating properties as the material of said first layer, said second layer being positioned within said bias field and said rotating field, a first pattern of magnetic propagating elements coupled to said second layer defining a first channel including a first detector section, a second pattern of magnetic propagating elements coupled to said second layer defining a second channel including a second detector section, each of said elements of said first and second channels being dimensioned for optimum propagation of domains of a first and a second predetermined diameter, respectively, means energizable to generate domains in each of said channels of a diameter as determined by the magnitude of said bias field at each revolution of said rotating field, the domains being propagated along said elements by said rotating field, first circuit means for each of said channels for connecting propagating elements of said first and second detector section in first groups including every nth element, second circuit means for each of said channels for connecting propagating elements of said first and second detector section in second groups including each of the elements between said elements of said first groups, said first and second circuit means of each of said channels being energizable by the presence of domains at the propagating elements of said first and second groups of elements to present voltage signals of a magnitude corresponding to the number of domains at each of said groups of elements, first and second comparison circuit means for said first and second channel, respectively, for generating first and second output signals indicative of the relative magnitudes of said voltage signals in said first and second circuit means of each of said detector sections, third comparison circuit means energizable responsive to the application of said first and second output signals for generating a control signal indicative of the diameter of said generated domains, means for interrogating said first and second comparison circuit means and for applying said first and second output signals to said third comparison circuit means at every nth revolution of said rotating field, and control means for adjusting the magnitude of said bias field energizable responsive to said control signal.

19. The combination as claimed in claim 18 in which said bias field source comprises a permanent magnet means and said control means comprises a winding coupled to said permanent magnet means.

20. A control arrangment for single-wall domain apparatus comprising a thin-film magnetic layer in which single-wall magnetic domains can be generated and propagated, a first and a second pattern of magnetic propagating elements coupled to said layer and defining, respectively, first and second channels, each of said elements of said first and second channel being dimensioned for optimum propagation of domains of a first and a second predetermined diameter, respectively, means including single-wall domain generating means for simultaneously initiating domains in said first and said second channels, and means including individual detector sections for said first and said second channels for determining the relative speeds of propagation of the initiated domains in said first and second channels.

21. A control arrangement in accordance with claim 20 wherein the single-wall domain apparatus further comprises bias field means and further comprising means responsive to said determining means for modifying the magnetic field of said bias field means.

* * * * *

UNITED STATES PATENT AND TRADEMARK OFFICE
CERTIFICATE OF CORRECTION

PATENT NO. : 4,117,544

DATED : September 26, 1978

INVENTOR(S) : Cyrus Frank Ault

It is certified that error appears in the above-identified patent and that said Letters Patent are hereby corrected as shown below:

Column 10, line 21, after "and" insert --a--; line 30, "sid" should read --said--. Column 11, line 10, after "in" cancel "said" (second occurrence); line 27, cancel "on" and insert --of--; line 51, "inplane" should read --in-plane--. Column 12, line 1, before "propagating" cancel "said" (first occurrence) and insert --the--.

Signed and Sealed this

Thirteenth Day of May 1980

[SEAL]

Attest:

SIDNEY A. DIAMOND

Attesting Officer

Commissioner of Patents and Trademarks